United States Patent
Chen et al.

(10) Patent No.: US 10,665,520 B2
(45) Date of Patent: May 26, 2020

(54) INTEGRATED CIRCUIT PACKAGE AND METHOD

(71) Applicant: Taiwan Semiconductor Manufacturing Company, Ltd., Hsinchu (TW)

(72) Inventors: Chien-Hsun Chen, Zhutian Township (TW); Yu-Ling Tsai, Hsinchu (TW); Jiun Yi Wu, Zhongli (TW); Chien-Hsun Lee, Chu-tung Town (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/173,488

(22) Filed: Oct. 29, 2018

(65) Prior Publication Data
US 2020/0135600 A1 Apr. 30, 2020

(51) Int. Cl.
*H01L 23/31* (2006.01)
*H01L 23/498* (2006.01)
*H01L 23/538* (2006.01)

(52) U.S. Cl.
CPC .... *H01L 23/3121* (2013.01); *H01L 23/49827* (2013.01); *H01L 23/5384* (2013.01)

(58) Field of Classification Search
None
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |

(Continued)

FOREIGN PATENT DOCUMENTS

| | | | | |
|---|---|---|---|---|
| DE | 102017102534 A1 * | 5/2018 | ......... | H01L 23/3128 |
| DE | 102017102534 A1 | 5/2018 | | |
| TW | I608575 B | 12/2017 | | |

*Primary Examiner* — Zandra V Smith
*Assistant Examiner* — Lawrence C Tynes, Jr.
(74) *Attorney, Agent, or Firm* — Slater Matsil, LLP

(57) ABSTRACT

In an embodiment, a device includes: a first integrated circuit die having a first contact region and a first non-contact region; an encapsulant contacting sides of the first integrated circuit die; a dielectric layer contacting the encapsulant and the first integrated circuit die, the dielectric layer having a first portion over the first contact region, a second portion over the first non-contact region, and a third portion over a portion of the encapsulant; and a metallization pattern including: a first conductive via extending through the first portion of the dielectric layer to contact the first integrated circuit die; and a conductive line extending along the second portion and third portion of the dielectric layer, the conductive line having a straight portion along the second portion of the dielectric layer and a first meandering portion along the third portion of the dielectric layer.

20 Claims, 19 Drawing Sheets

(56) References Cited

U.S. PATENT DOCUMENTS

| | | | |
|---|---|---|---|
| 9,741,690 B1* | 8/2017 | Hsieh | H01L 24/20 |
| 9,997,464 B2 | 6/2018 | Hsieh et al. | |
| 2003/0066679 A1* | 4/2003 | Castro | H01L 21/4857 |
| | | | 174/255 |
| 2008/0048322 A1* | 2/2008 | Baek | H01L 23/3114 |
| | | | 257/738 |
| 2011/0242468 A1* | 10/2011 | Choi | C08G 8/12 |
| | | | 349/129 |
| 2011/0254155 A1* | 10/2011 | Lin | H01L 21/6835 |
| | | | 257/737 |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0075902 A1 | 3/2013 | Chow et al. | |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1* | 9/2014 | Hung | H01L 23/481 |
| | | | 257/774 |
| 2014/0264930 A1 | 9/2014 | Yu et al. | |
| 2015/0214173 A1* | 7/2015 | Wen | H01L 24/17 |
| | | | 257/737 |
| 2015/0311148 A1* | 10/2015 | Jung | H01L 23/4985 |
| | | | 361/767 |
| 2016/0322337 A1 | 11/2016 | Liang et al. | |
| 2017/0373030 A1 | 12/2017 | Lee et al. | |
| 2018/0040546 A1 | 2/2018 | Yu et al. | |
| 2018/0122774 A1* | 5/2018 | Huang | H01L 24/32 |

\* cited by examiner

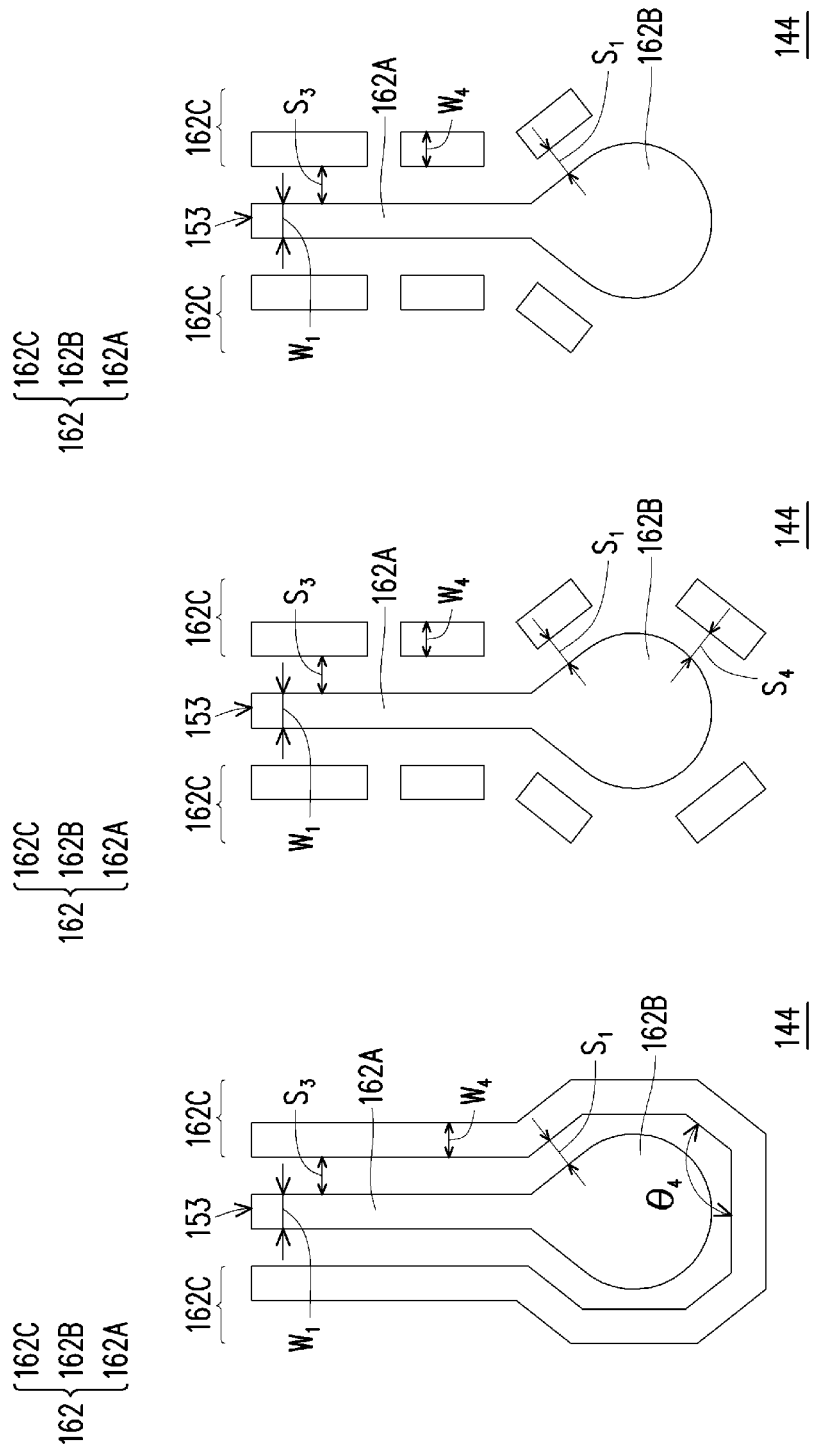

INTEGRATED CIRCUIT PACKAGE AND METHOD

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A, 11B, 11C, 11D, 11E, and 11F are top-down views of a metallization pattern, in accordance with various embodiments.

DETAILED DESCRIPTION

Figure 1:
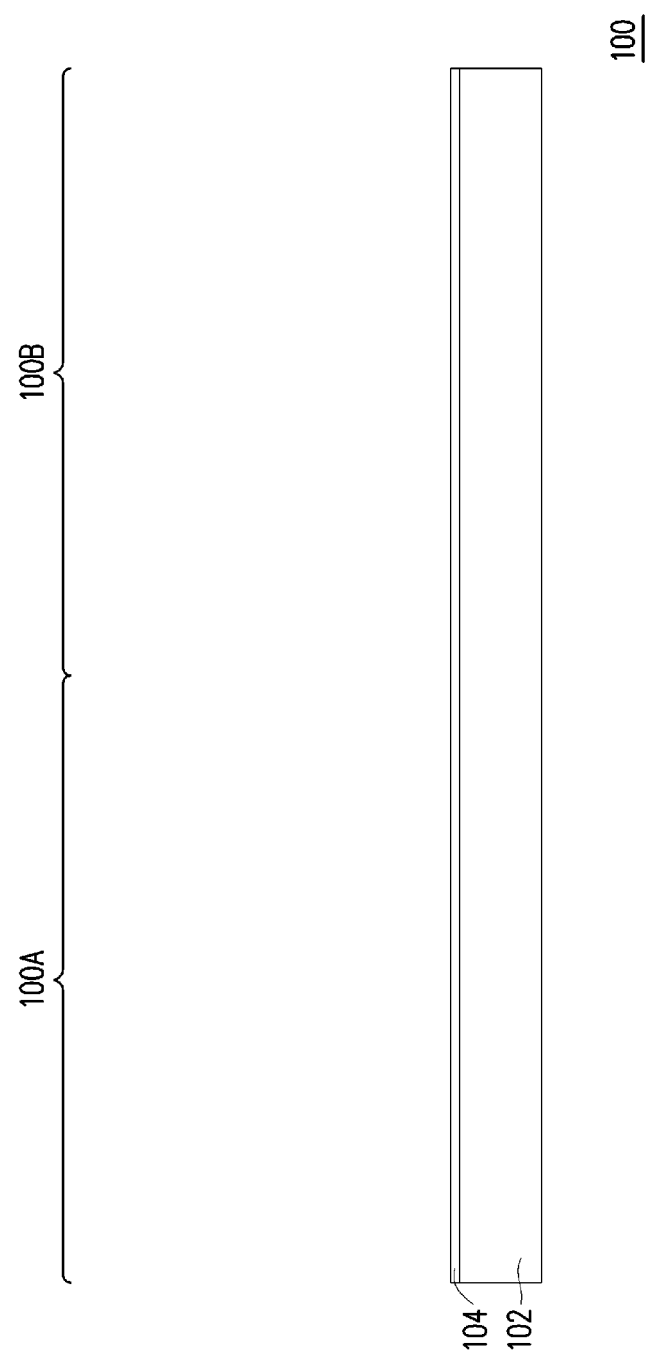
FIGS. 1 through 8 are cross-sectional views of intermediate steps during a process for forming a package component, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a redistribution structure is formed having a metallization pattern. The metallization pattern includes conductive vias electrically connected to underlying integrated circuit dies, and conductive lines connecting the conductive vias. The metallization pattern includes straight conductive lines disposed over gaps between the integrated circuit dies, and further includes meandering conductive lines disposed over non-contact regions of the integrated circuit dies. With high-density integrated circuit dies, such as high bandwidth memory or system-on-a-chip modules, the contact areas of respective dies may be disposed a very large distance from one another. By forming meandering conductive lines over the non-contact areas of the dies, mechanical strength of the conductive lines may be improved, as the meandering conductive lines act as a spring to absorb mechanical stress. In some embodiments, dummy conductive features are also formed at least partially around the conductive lines. The dummy conductive features may provide protection during subsequent etching processes, avoiding width loss of the conductive lines.

Figure 16:
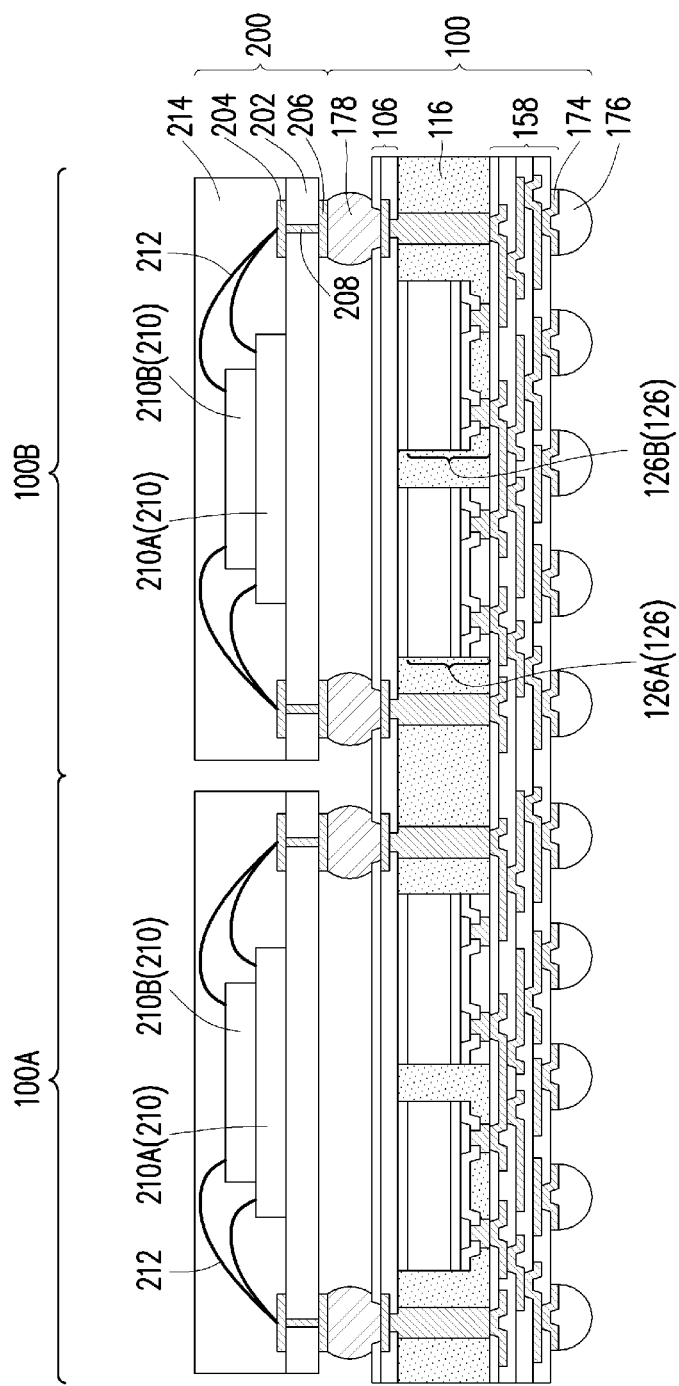
FIGS. 16 and 17 illustrate integrated circuit device stacks, in accordance with some embodiments.
Figure 17:
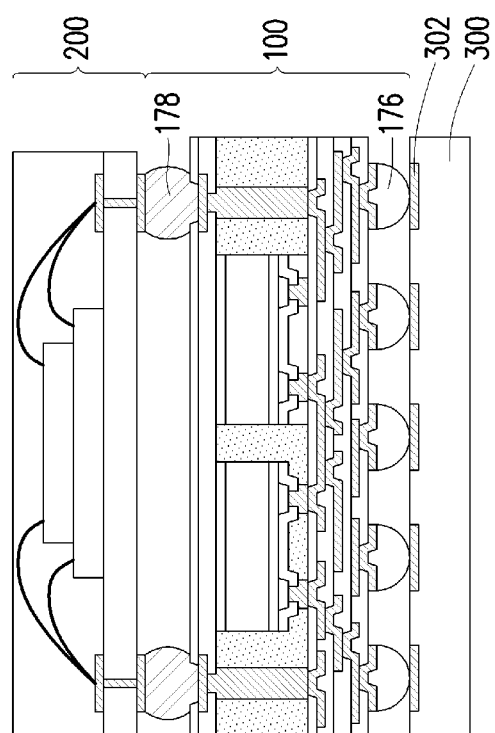

FIGS. 1 through 15 illustrate cross-sectional views of intermediate steps during a process for forming a first package component 100, in accordance with some embodiments. A first package region 100A and a second package region 100B are illustrated, and an integrated circuit package is formed in each of the package regions 100A and 100B. The integrated circuit packages may also be referred to as integrated fan-out (InFO) packages. FIG. 16 illustrates an integrated circuit device stack, in accordance with some embodiments. FIG. 17 illustrates an implementing device, in accordance with some embodiments.

In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of coplanarity.

Figure 2:
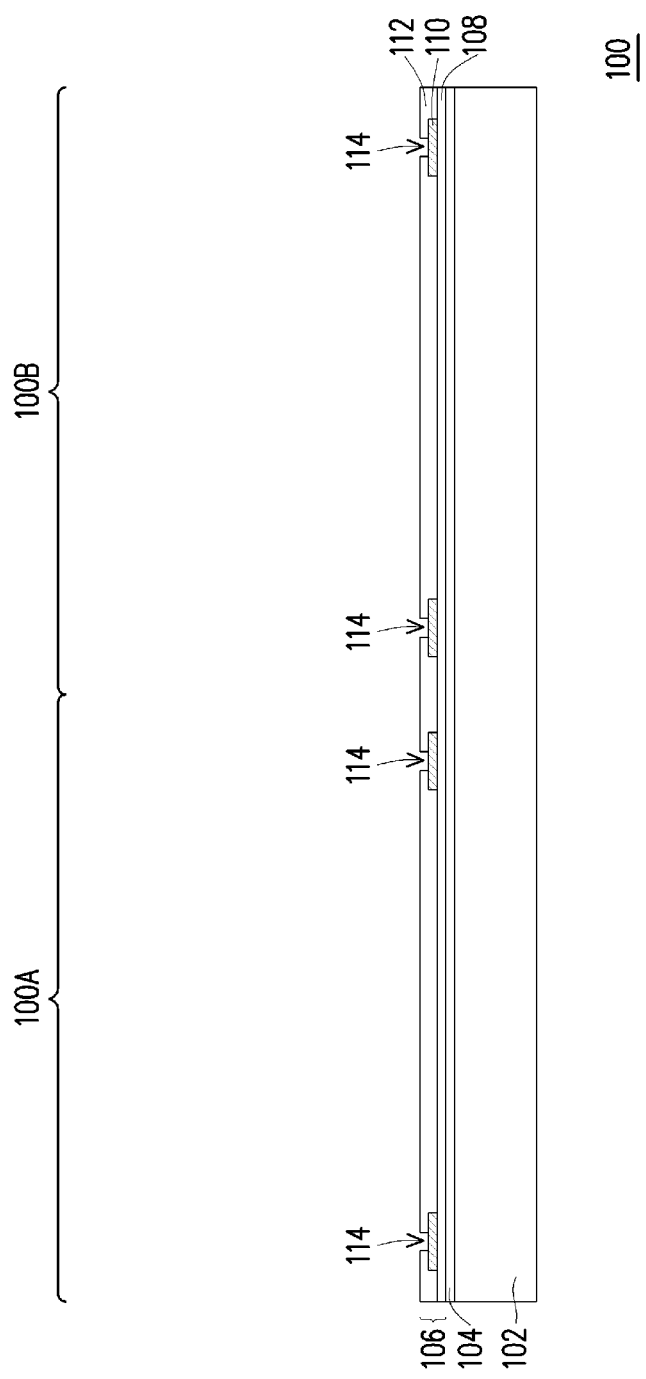

In FIG. 2, a back-side redistribution structure 106 may be formed on the release layer 104. In the embodiment shown, the back-side redistribution structure 106 includes a dielectric layer 108, a metallization pattern 110 (sometimes referred to as redistribution layers or redistribution lines), and a dielectric layer 112. The back-side redistribution structure 106 is optional, and in some embodiments only the dielectric layer 108 is formed.

The dielectric layer 108 is formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, chemical vapor deposition (CVD), laminating, the like, or a combination thereof.

The metallization pattern 110 may be formed on the dielectric layer 108. As an example to form metallization pattern 110, a seed layer is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 may be formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof. The dielectric layer 112 is then patterned to form openings 114 exposing portions of the metallization pattern 110. The patterning may be formed by an acceptable process, such as by exposing the dielectric layer 112 to light when the dielectric layer 112 is a photo-sensitive material or by etching using, for example, an anisotropic etch.

It should be appreciated that the back-side redistribution structure 106 may include any number of dielectric layers and metallization patterns. Additional dielectric layers and metallization patterns may be formed by repeating the processes for forming the metallization pattern 110 and dielectric layer 112. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 3:
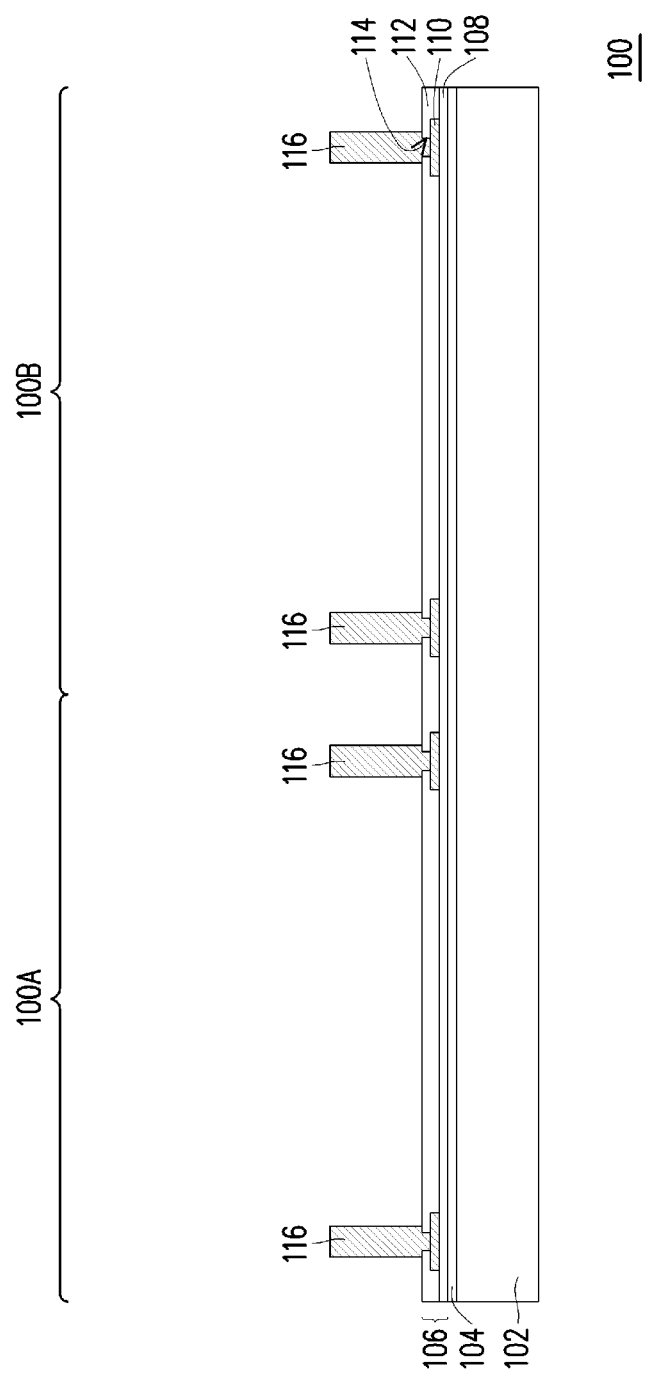

In FIG. 3, through vias 116 are formed in the openings 114 and extending away from the topmost dielectric layer of the back-side redistribution structure 106 (e.g., the dielectric layer 112 in the illustrated embodiment). As an example to form the through vias 116, a seed layer is formed over the back-side redistribution structure 106, e.g., on the dielectric layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Figure 4:
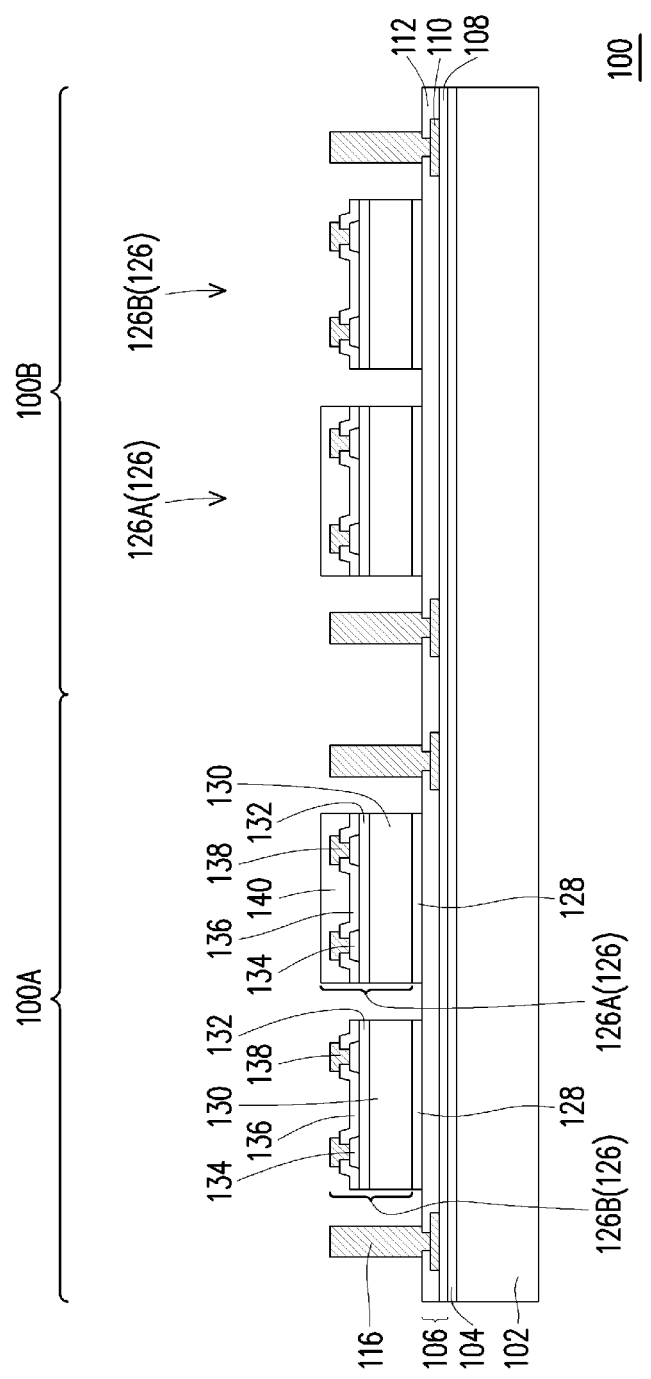

In FIG. 4, integrated circuit dies 126 are adhered to the dielectric layer 112 by an adhesive 128. The integrated circuit dies 126 may be logic dies (e.g., central processing unit, microcontroller, etc.), memory dies (e.g., dynamic random access memory (DRAM) die, static random access memory (SRAM) die, high bandwidth memory (HBM) cube, wide-I/O memory cube, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 126 may be different sizes (e.g., different heights and/or surface areas), and in other embodiments, the integrated circuit dies 126 may be the same size (e.g., same heights and/or surface areas).

Before being adhered to the dielectric layer 112, the integrated circuit dies 126 may be processed according to applicable manufacturing processes to form integrated circuits in the integrated circuit dies 126. For example, the integrated circuit dies 126 each include a semiconductor substrate 130, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 130 and may be interconnected by interconnect structures 132 formed by, for example, metallization patterns in one or more dielectric layers on the semiconductor substrate 130 to form an integrated circuit.

The integrated circuit dies 126 further comprise pads 134, such as aluminum pads, to which external connections are made. The pads 134 are on what may be referred to as respective active sides of the integrated circuit dies 126. Passivation films 136 are on the integrated circuit dies 126 and on portions of the pads 134. Openings extend through the passivation films 136 to the pads 134. Die connectors 138, such as conductive pillars (for example, comprising a metal such as copper), extend through the openings in the passivation films 136 and are mechanically and electrically coupled to the respective pads 134. The die connectors 138 may be formed by, for example, plating, or the like. The die connectors 138 electrically couple the respective integrated circuits of the integrated circuit dies 126.

A dielectric material 140 may be on the active sides of the integrated circuit dies 126, such as on the passivation films 136 and the die connectors 138. The dielectric material 140 may be on a subset of the integrated circuit dies 126. In the embodiment shown, the dielectric material 140 is on the active sides of the first integrated circuit dies 126A (e.g., the logic devices), with the active sides of the second integrated circuit dies 126B (e.g., the memory device) being free from the dielectric material 140. The dielectric material 140 laterally encapsulates the die connectors 138, and the dielectric material 140 is laterally coterminous with the respective integrated circuit dies 126. The dielectric material 140 may also bury the die connectors 138, such that the topmost surface of the dielectric material 140 is above the topmost surfaces of the die connectors 138. The dielectric material 140 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 128 is on back-sides of the integrated circuit dies 126 and adheres the integrated circuit dies 126 to the back-side redistribution structure 106, such as the dielectric layer 112. The adhesive 128 may be any suitable adhesive, epoxy, die attach film (DAF), or the like. The adhesive 128 may be applied to a back-side of the integrated circuit dies 126 or may be applied over the surface of the carrier substrate 102. For example, the adhesive 128 may be applied to the back-side of the integrated circuit dies 126 before singulating to separate the integrated circuit dies 126.

It should be appreciated that any number of integrated circuit dies 126 may be adhered in each of the first package region 100A and the second package region 100B. In the embodiment shown, multiple integrated circuit dies 126 are adhered adjacent one another. The integrated circuit dies 126 in each package region include a first integrated circuit die 126A and a second integrated circuit die 126B. The first integrated circuit die 126A may be a logic device, such as a central processing unit (CPU), graphics processing unit (GPU), system-on-a-chip (SoC), microcontroller, or the like. The second integrated circuit die 126B may be a memory device, such as a dynamic random access memory (DRAM) die, static random access memory (SRAM) die, hybrid memory cube (HMC) module, a high bandwidth memory (HBM) module, or the like. In some embodiments, the integrated circuit dies 126A and 126B may be the same type of dies, such as SoC dies. The integrated circuit dies 126 may vary in size. In embodiments where the integrated circuit dies 126 have a large footprint, the space available for the through vias 116 in the package regions may be limited. Use of the back-side redistribution structure 106 allows for an improved interconnect arrangement when the package regions have limited space available for the through vias 116.

Figure 5:
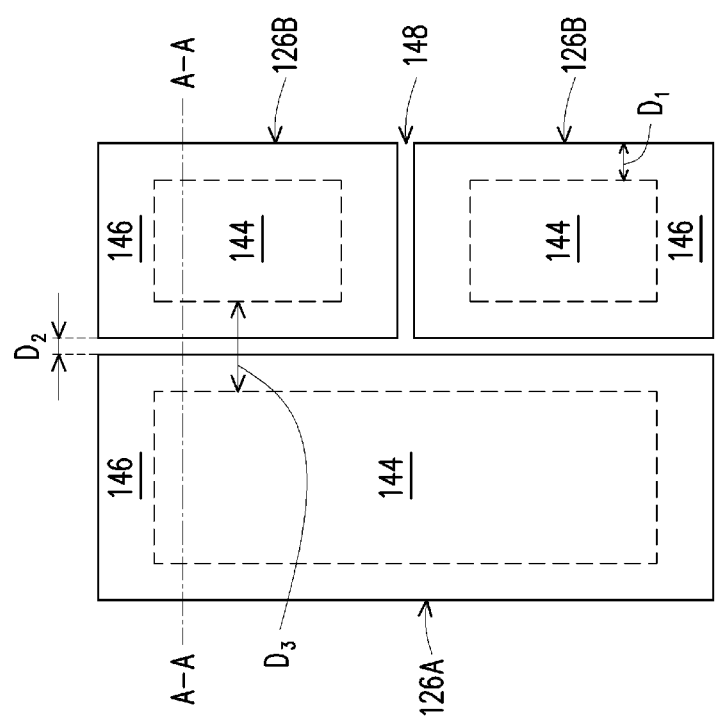

FIG. 5 is a top-down view of the integrated circuit dies 126, where FIG. 4 is shown along cross-section line A-A of FIG. 5. FIG. 5 shows one of the package regions 100A/100B from FIG. 4, and shows an embodiment where the integrated circuit dies 126A and 126B are different types of dies. In such embodiments, there may be more than one of the integrated circuit dies 126B (e.g., there may be multiple memory devices). The integrated circuit dies 126 each have a contact region 144 and a non-contact region 146. The die connectors 138 are disposed in the contact region 144, with the non-contact region 146 being the remainder of the area of the top surface of the integrated circuit dies 126 that is free from the die connectors 138. The contact region 144 of each integrated circuit die 126 is a single continuous region that includes all of the die connectors 138 of the integrated circuit die 126. The non-contact region 146 of each integrated circuit die 126 is a single continuous region that surrounds the respective contact region 144, is disposed adjacent the edges of the integrated circuit die 126. In other words, the non-contact regions 146 extend from the edges of the integrated circuit dies 126 to the contact regions 144. The non-contact regions 146 may also be referred to as standoff regions. The die connectors 138 of the integrated circuit dies 126A and 126B may have different pitches. In embodiments where the integrated circuit dies 126A and 126B are the same type of dies, the contact regions 144 and non-contact regions 146 may be the same sizes in the integrated circuit dies 126A and 126B. In embodiments where the integrated circuit dies 126A and 126B are different types of dies, the contact regions 144 and non-contact regions 146 may be different sizes in the integrated circuit dies 126A and 126B. As an example, in some embodiments, the non-contact regions 146 may occupy from about 10% to about 50% of the area of the top surface of the integrated circuit dies 126, and may extend inward from the edges of the integrated circuit dies 126 by a distance $D_1$, which may be in the range of from about 5 µm to about 1000 µm. The integrated circuit dies 126 are spaced apart by gap regions 148. The gap regions 148 may extend between adjacent integrated circuit dies 126 by a distance $D_2$, which may be less than the distance $D_1$. In some embodiments, the distance $D_2$ is in the range of from about 2 µm to about 6 µm. The distance $D_3$ between the contact regions 144 of adjacent integrated circuit dies 126 may be large; in embodiments where fine-pitch devices such as HBMs are used, the distance $D_3$ may be as large as 4000 µm to 5000 µm.

Figure 6:
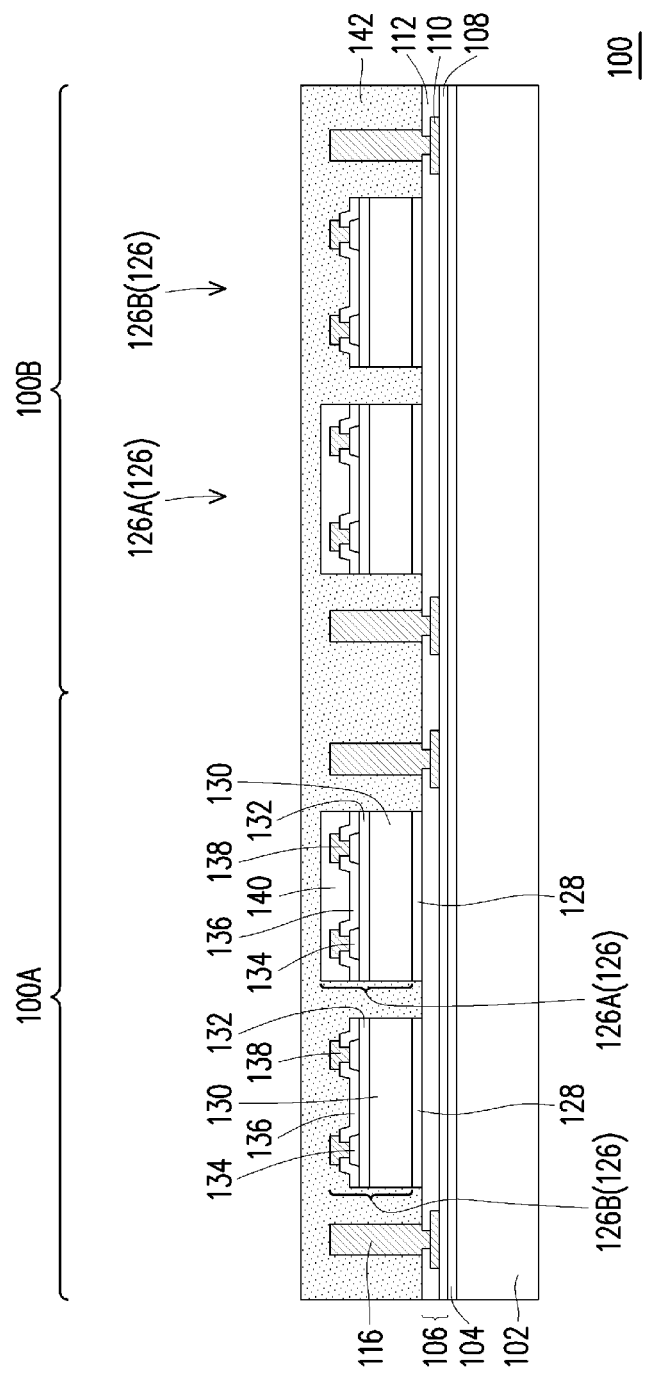

In FIG. 6, an encapsulant 142 is formed on the various components. After formation, the encapsulant 142 encapsulates the through vias 116 and integrated circuit dies 126. The encapsulant 142 may be a molding compound, epoxy, or the like. The encapsulant 142 may be applied by compression molding, transfer molding, or the like, and may be formed over the carrier substrate 102 such that the through vias 116 and/or the integrated circuit dies 126 are buried or covered. In embodiments where the integrated circuit dies 126B omit the dielectric material 140, the encapsulant 142 also encapsulates the die connectors 138 of the integrated circuit dies 126B. The encapsulant 142 is further formed in the gap regions 148 between the integrated circuit dies 126. The encapsulant 142 is then cured.

Figure 7:
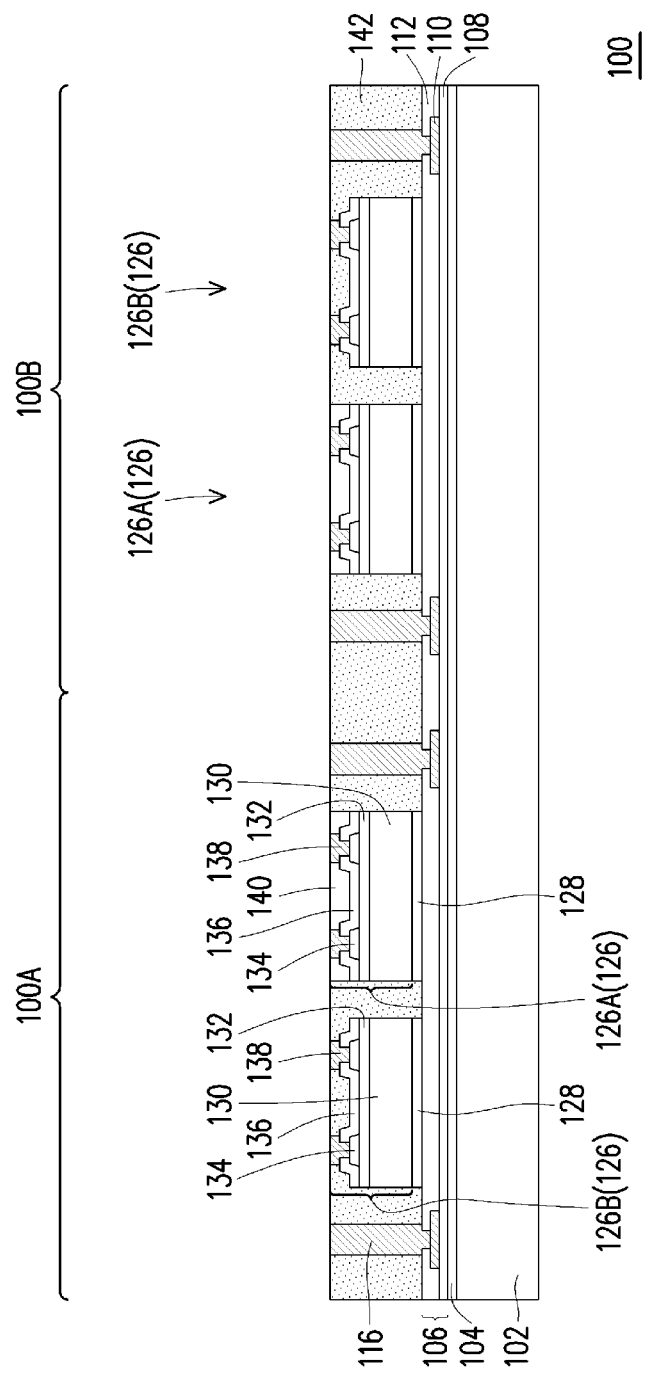

In FIG. 7, a planarization process is performed on the encapsulant 142 to expose the through vias 116 and the die connectors 138. The planarization process may also grind the dielectric material 140 and encapsulant 142 until the die connectors 138 are exposed. Top surfaces of the through vias 116, die connectors 138, dielectric material 140, and encapsulant 142 are coplanar after the planarization process. The planarization process may be, for example, a chemical-mechanical polish (CMP), a grinding process, or the like. In some embodiments, the planarization may be omitted, for example, if the through vias 116 and die connectors 138 are already exposed.

In FIGS. 8 through 12, a front-side redistribution structure 158 is formed over the through vias 116, encapsulant 142, and integrated circuit dies 126. The front-side redistribution structure 158 includes dielectric layers 160, 164, 168, and 172; metallization patterns 162, 166, and 170; and under bump metallurgies (UBMs) 174. The metallization patterns may also be referred to as redistribution layers or redistribution lines. The front-side redistribution structure 158 is shown as an example. More or fewer dielectric layers and metallization patterns may be formed in the front-side redistribution structure 158. If fewer dielectric layers and metallization patterns are to be formed, steps and process discussed below may be omitted. If more dielectric layers and metallization patterns are to be formed, steps and processes discussed below may be repeated.

Figure 8:
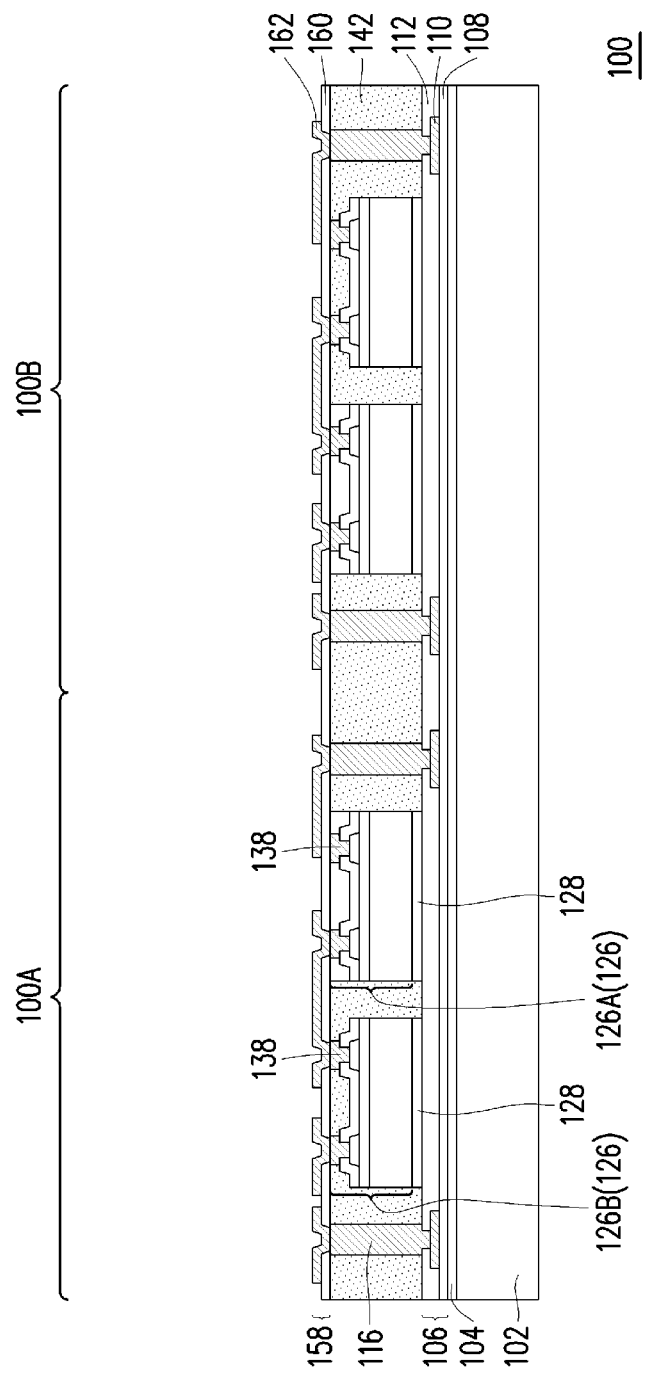

In FIG. 8, the dielectric layer 160 is deposited on the encapsulant 142, through vias 116, and die connectors 138. In some embodiments, the dielectric layer 160 is formed of a photo-sensitive material such as PBO, polyimide, BCB, or the like, which may be patterned using a lithography mask. The dielectric layer 160 may be formed by spin coating, lamination, CVD, the like, or a combination thereof. The dielectric layer 160 is then patterned. The patterning forms openings exposing portions of the through vias 116 and the die connectors 138. The patterning may be by an acceptable process, such as by exposing the dielectric layer 160 to light when the dielectric layer 160 is a photo-sensitive material or by etching using, for example, an anisotropic etch. If the dielectric layer 160 is a photo-sensitive material, the dielectric layer 160 can be developed after the exposure.

The metallization pattern 162 is then formed. The metallization pattern 162 includes conductive lines 162A (see FIG. 9A) on and extending along the major surface of the dielectric layer 160. The metallization pattern 162 further includes conductive vias 162B (see FIG. 9A) extending through the dielectric layer 160 to be physically and electrically connected to the through vias 116 and the integrated circuit dies 126. To form the metallization pattern 162, a seed layer is formed over the dielectric layer 160 and in the openings extending through the dielectric layer 160. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 162. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 162. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 9A:
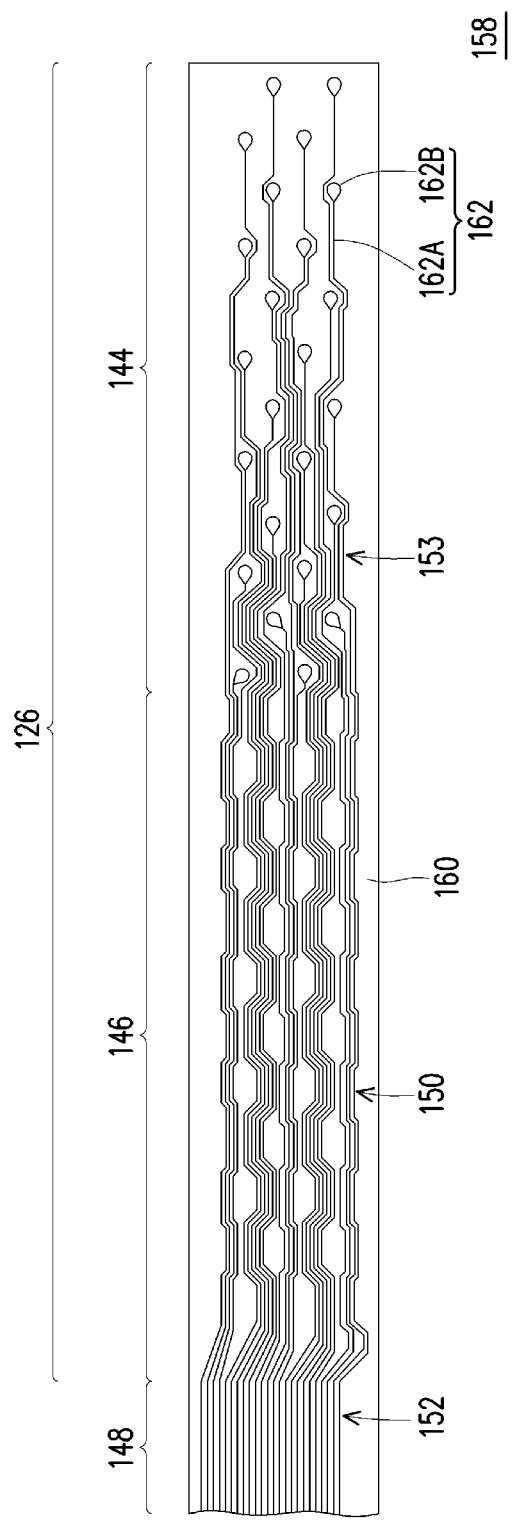
FIGS. 9A, 9B, and 10 are top-down views of a metallization pattern, in accordance with some embodiments.

FIG. 9A is a top-down view of the metallization pattern 162 and dielectric layer 160. Portions of the metallization pattern 162 over an integrated circuit die 126 and a gap region 148 are shown. The metallization pattern 162 has different shapes over different regions of the integrated circuit dies 126. In particular, the metallization pattern 162 has a first shape in the contact region 144 of the integrated circuit dies 126, a second shape in the non-contact region 146 of the integrated circuit dies 126, and a third shape in the gap regions 148 between adjacent integrated circuit dies. The first, second, and third shapes may be different. Notably, the distance between adjacent conductive lines 162A of the metallization pattern 162 is different in the different regions. The distance between conductive lines 162A in the contact region 144 and non-contact region 146 is less than the distance between conductive lines 162A in the gap region 148. In other words, the conductive lines 162A have a greater density in the contact region 144 and non-contact region 146 than in the gap region 148. For example, in some embodiments, the conductive lines 162A have a first pitch in the contact region 144 of from about 1 μm to about 10 μm; the conductive lines 162A have a second pitch in the non-contact region 146 of from about 1 μm to about 20 μm; and the conductive lines 162A have a third pitch in the gap region 148 of from about 1 μm to about 10 μm.

In the non-contact region 146, the conductive lines 162A have meandering portions 150. In the gap regions 148, the conductive lines 162A have a straight portion 152. The shape of the meandering portions 150 is discussed further below, and the gap region 148 is free from the meandering portions 150. In the contact region 144, the conductive lines 162A have a connecting portion 153 that terminates at the conductive vias 162B. The connecting portion 153 may be straight or may include meandering portions.

Figure 9B:
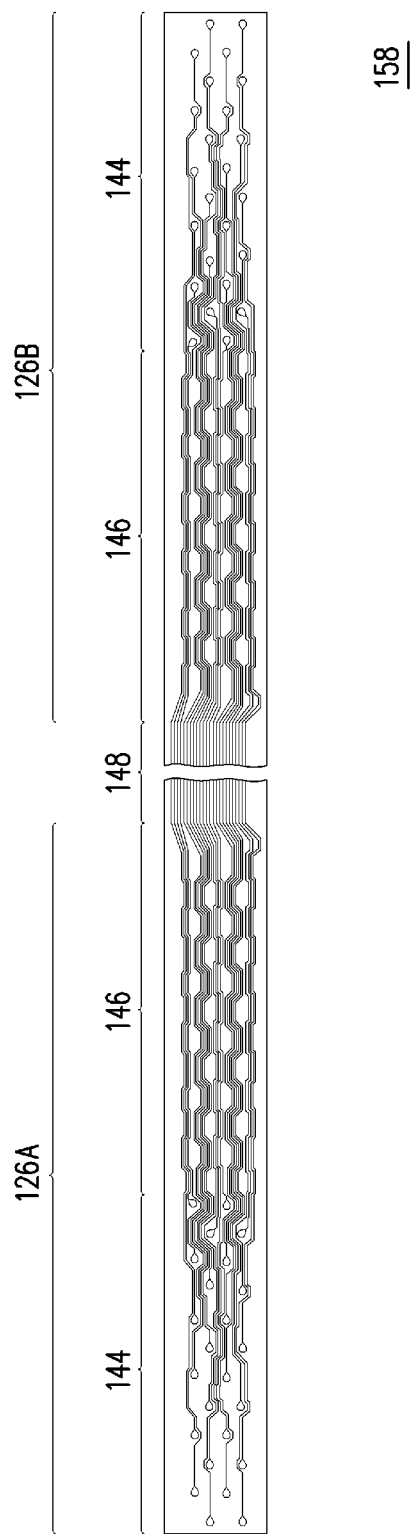

It should be appreciated that FIG. 9A shows portions of the metallization pattern 162 over one of the integrated circuit dies 126 and one of the gap regions 148. FIG. 9B is a further view of the metallization pattern 162, illustrating that the metallization pattern 162 extends over both of the integrated circuit dies 126A and 126B, and the encapsulant 142 in the corresponding gap region 148 between the integrated circuit dies 126A and 126B.

Figure 10:
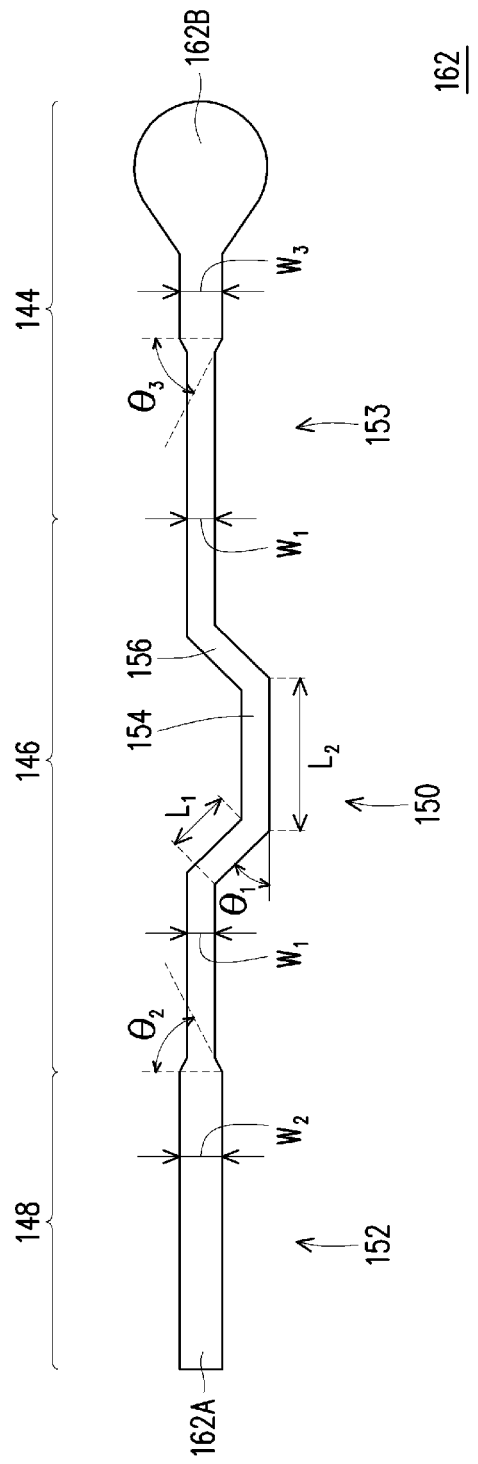

FIG. 10 is a representative view of a portion of the metallization pattern 162. A single conductive line 162A and conductive via 162B of the metallization pattern 162 is shown. It should be appreciated that the metallization pattern 162 includes many conductive lines and vias. In some embodiments, all of the conductive lines 162A have the meandering portions 150 described herein. In some embodiments, only a subset of the conductive lines 162A have the meandering portions 150, and other subsets of the conductive lines and vias (e.g., portions connected to the through vias 116) may not include the meandering portions 150.

The meandering portions 150 of the conductive lines 162A have a first width $W_1$. In some embodiments, the first width $W_1$ is in the range of from about 0.5 μm to about 5 μm (such as about 1.9 μm). The meandering portions 150 of the conductive lines 162A include a first segment 154 and second segments 156 connecting the first segment 154 to the straight portion 152 of the conductive lines 162A. The second segments 156 have a first length $L_1$, which may be greater than or equal to about 20% of the first width $W_1$. In some embodiments, the first length $L_1$ is in the range of from about 0.1 μm to about 50 μm. The second segments 156 deflect from the longitudinal axis of the straight portion 152 by a first angle $\theta_1$, which may be less than 90 degrees. In some embodiments, the first angle $\theta_1$ is in the range of from about 10 degrees to about 80 degrees. The first segment 154 has a second length $L_2$, which may be up to 10% of the total length of the conductive line 162A. In some embodiments, the second length $L_2$ is in the range of from about 10 μm to about 600 μm. The longitudinal axis of the first segment 154 may be parallel to the longitudinal axis of the straight portion 152.

As noted above, the distance $D_3$ (see FIG. 5) may be large. The non-contact regions 146 may occupy a significant portion of the distance $D_3$. However, the meandering portions 150 of the conductive lines 162A (e.g., in the non-contact regions 146) are thinner and spaced closer together than the straight portions 152 of the conductive lines 162A (e.g., in the gap region 148). Mechanical reliability issues of the conductive lines 162A may thus be exacerbated in the non-contact regions 146. The meandering portions 150 act as a spring to absorb mechanical stress exerted on the front-side redistribution structure 158. Inclusion of the meandering portions 150 in the non-contact regions 146 may increase the mechanical strength of the conductive lines 162A by as much as 17%. The electrical performance of the conductive lines 162A may not be significantly decreased with inclusion of the meandering portions 150.

The straight portions 152 of the conductive lines 162A have a second width $W_2$. The second width $W_2$ is greater than the first width $W_1$, and may be up to three times the first width $W_1$. In some embodiments, the second width $W_2$ is in the range of from about 0.6 μm to about 5.5 μm. The straight portions 152 of the conductive lines 162A have a single longitudinal axis in the gap region 148. In other words, the straight portions 152 are each continuous conductive features extending along a single longitudinal axis from a first side of the gap region 148 to a second side of the gap region 148. The straight portions 152 have a uniform second width $W_2$ in the gap region 148.

The connecting portions 153 of the conductive lines 162A may have a single longitudinal axis in the contact region 144, or may have further meandering portions in the contact region 144. The connecting portions 153 are electrically connected to the straight portions 152 by the meandering portions 150. The connecting portions 153 of the conductive lines 162A may have several widths. Most of the connecting portions 153 of the conductive lines 162A have the first width $W_1$, and some of the connecting portions 153 of the conductive lines 162A have a third width $W_3$ (discussed further below). The third width $W_3$ is greater than the first width $W_1$ and less than the second width $W_2$, and may be up to three times the first width $W_1$. In some embodiments, the third width $W_3$ is in the range of from about 0.6 μm to about 5.5 μm (such as about 2.2 am). The conductive lines 162A having multiple widths in the contact regions 144 is optional. In some embodiments, the connecting portions 153 of the conductive lines 162A have a uniform width, such as the first width $W_1$.

At the transitions from the first width $W_1$ to the widths $W_2/W_3$, sides of the conductive line 162A deflect outwards. When transitioning from the first width $W_1$ to the second width $W_2$, sidewalls of the conductive lines 162A form a second angle $\theta_2$ with the latitudinal axis of the conductive line 162A. In some embodiments, the second angle $\theta_2$ is in the range of from about 10 degrees to about 80 degrees. When transitioning from the first width $W_1$ to the third width $W_3$, sidewalls of the conductive lines 162A form a third angle $\theta_3$ with the latitudinal axis of the conductive line 162A. In some embodiments, the third angle $\theta_3$ is in the range of from about 10 degrees to about 80 degrees (such as being less than or equal to about 85 degrees).

FIGS. 11A through 11F are further detailed views of the metallization pattern 162, in accordance with some embodiments. In some embodiments, the metallization pattern 162 includes dummy conductive features 162C in the contact region 144. The dummy conductive features 162C are around the conductive vias 162B, and the connecting portions 153 of the conductive lines 162A. The dummy conductive features 162C are not connected to input/output (I/O) terminals. Rather, the dummy conductive features 162C are floating terminals, connected to power terminals, or connected to ground terminals (e.g., by vias from overlying metallization patterns). The dummy conductive features 162C may be formed concurrently with the conductive lines 162A and conductive vias 162B, e.g., during the patterning of the dielectric layer 160 and the plating of the metallization pattern 162. FIGS. 11A through 11F show different variations of the dummy conductive features 162C.

Figures 11A, 11B, 11C:
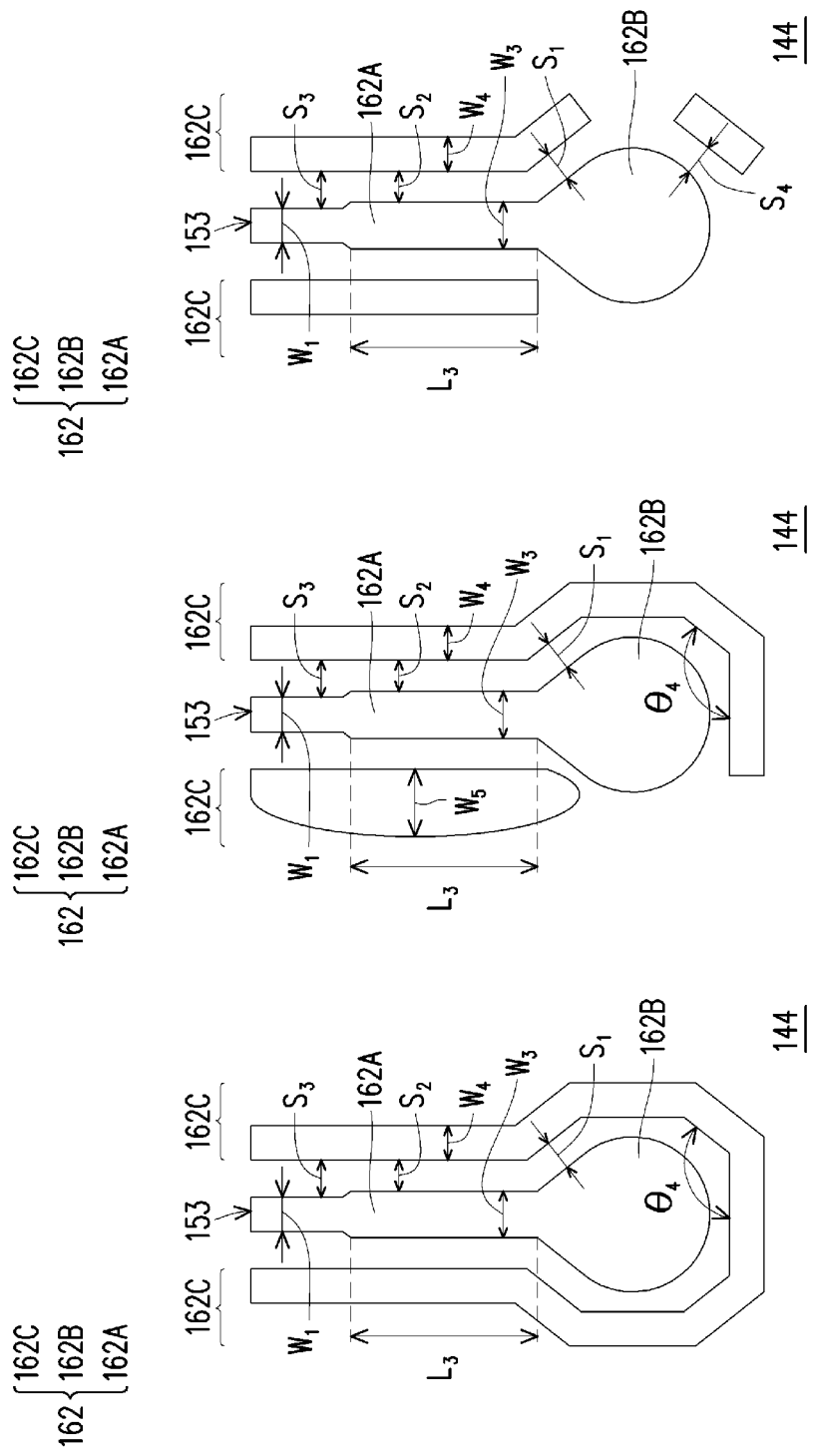

In the embodiment of FIG. 11A, the dummy conductive feature 162C is a single continuous conductive bar extending around the conductive via 162B. The conductive bar also extends around the portion of the conductive line 162A having the enlarged third width $W_3$. The portions of the conductive line 162A with the third width $W_3$ have a third length $L_3$, with the third length $L_3$ being from about one to about fifty times the first width $W_1$. In some embodiments, the third length $L_3$ is in the range of from about 1 μm to about 50 μm. The conductive bar has a fourth width $W_4$, which may be different than the first width $W_1$ and the second width $W_2$. In some embodiments, the fourth width $W_4$ is in the range of from about 0.5 μm to about 5 μm. Portions of the conductive bar extending around the conductive via 162B may have any shape, such as a circular shape or an N-sided polygon shape. In the embodiment shown, the conductive bar has a polygon shape having internal angles $\theta_4$ of 135 degrees. The internal angles $\theta_4$ vary based on the quantity of sides of the shape. The conductive bar is also disposed a predetermined spacing from the conductive line 162A and conductive via 162B. The conductive bar is disposed a first spacing $S_1$ from the conductive via 162B, a second spacing $S_2$ from portions of the conductive line 162A having the third width $W_3$, and a third spacing $S_3$ from portions of the conductive line 162A having the first width $W_1$. The first spacing $S_1$ may be greater than or equal to the second spacing $S_2$, and the second spacing $S_2$ may be less than the third spacing $S_3$. The spacings $S_1/S_2/S_3$ are greater than or equal to at least 10% of the first width $W_1$, and may be less than or equal to at least three times the first width $W_1$. For example, in some embodiments, the first spacing $S_1$ is in the range of from about 0.5 μm to about 5 μm; the second spacing $S_2$ is in the range of from about 0.5

µm to about 5 µm; and the third spacing $S_3$ is in the range of from about 0.5 µm to about 5 µm.

In the embodiment of FIG. 11B, the dummy conductive feature 162C includes a conductive bar extending along a first side of the conductive line 162A, and a conductive island extending along a second side of the conductive line 162A. The conductive bar may extend also partially around the conductive via 162B. The conductive bar and conductive island may have different shapes and sizes. The conductive bar includes at least two straight segments.

The conductive island extends along a second side of the conductive line 162A and along at least a portion of the conductive via 162B. The conductive island includes a first straight side, a second straight side, and a curved side connecting the first straight side to the second straight side. The conductive island has a fifth width $W_5$, which is greater than the fourth width $W_4$. In some embodiments, the fifth width $W_5$ is in the range of from about 0.5 µm to about 20 µm.

In the embodiment of FIG. 11C, the dummy conductive feature 162C includes a conductive bar extending along a first side of the conductive line 162A, and multiple conductive traces disposed discontinuously along a second side of the conductive line 162A. The conductive bar may also extend partially around the conductive via 162B, and the conductive traces may also be disposed discontinuously around only a portion of the conductive via 162B. The conductive bar is longer than the conductive traces, and includes at least two straight segments. Each of the conductive traces are a single straight segment, and may each of the conductive traces may have a same length. The conductive traces are disposed a fourth spacing $S_4$ from the conductive via 162B. In some embodiments, the fourth spacing $S_4$ is in the range of from about 0.5 µm to about 5 µm.

In the embodiment of FIG. 11D, the dummy conductive feature 162C is a single continuous conductive bar extending around the conductive via 162B. The embodiment of FIG. 11D is similar to the embodiment of FIG. 11A, except the conductive lines 162A have a uniform first width $W_1$ in the contact regions 144. As such, the conductive lines 162A do not have multiple widths in the contact regions 144.

In the embodiment of FIG. 11E, the dummy conductive feature 162C includes multiple conductive traces disposed discontinuously along both sides of the conductive line 162A and around all of the conductive via 162B. The conductive lines 162A have a uniform first width $W_1$ in the contact regions 144. As such, the conductive lines 162A do not have multiple widths in the contact regions 144. The conductive traces are disposed the fourth spacing $S_4$ from the conductive via 162B.

In the embodiment of FIG. 11F, the dummy conductive feature 162C includes multiple conductive traces disposed discontinuously along both sides of the conductive line 162A, and around only a portion of the conductive via 162B. The conductive lines 162A have a uniform first width $W_1$ in the contact regions 144. As such, the conductive lines 162A do not have multiple widths in the contact regions 144.

As noted above, after the metallization pattern 162 is formed, the seed layer on which conductive material is formed is removed. The removal may be by an acceptable etching process, such as by wet or dry etching. During the seed layer removal, some etching of the metallization pattern 162 also occurs, reducing the widths of the conductive lines 162A to the widths $W_1/W_2/W_3$. The density of the metallization pattern 162 may affect the etching rate of the metallization pattern 162. In areas with a greater pattern density, the etchants may be consumed more quickly because there is more conductive material to etch. As such, areas with a greater pattern density may suffer less width loss during the seed layer removal. Forming the dummy conductive features 162C increases the pattern density in the contact regions 144, providing protection to the conductive lines 162A and conductive vias 162B during etching. Avoiding width loss may be particularly advantageous with finer-pitch metallization patterns, as the risk of line breakage may be reduced. Further, forming the meandering portions 150 in the non-contact regions 146 increases the pattern density in the non-contact regions 146. As such, a better coefficient of thermal expansion (CTE) match may be achieved between the metallization pattern 162 and overlying dielectric layers (e.g., the dielectric layer 164, see below), reducing the risk of line breakage.

Figure 12:
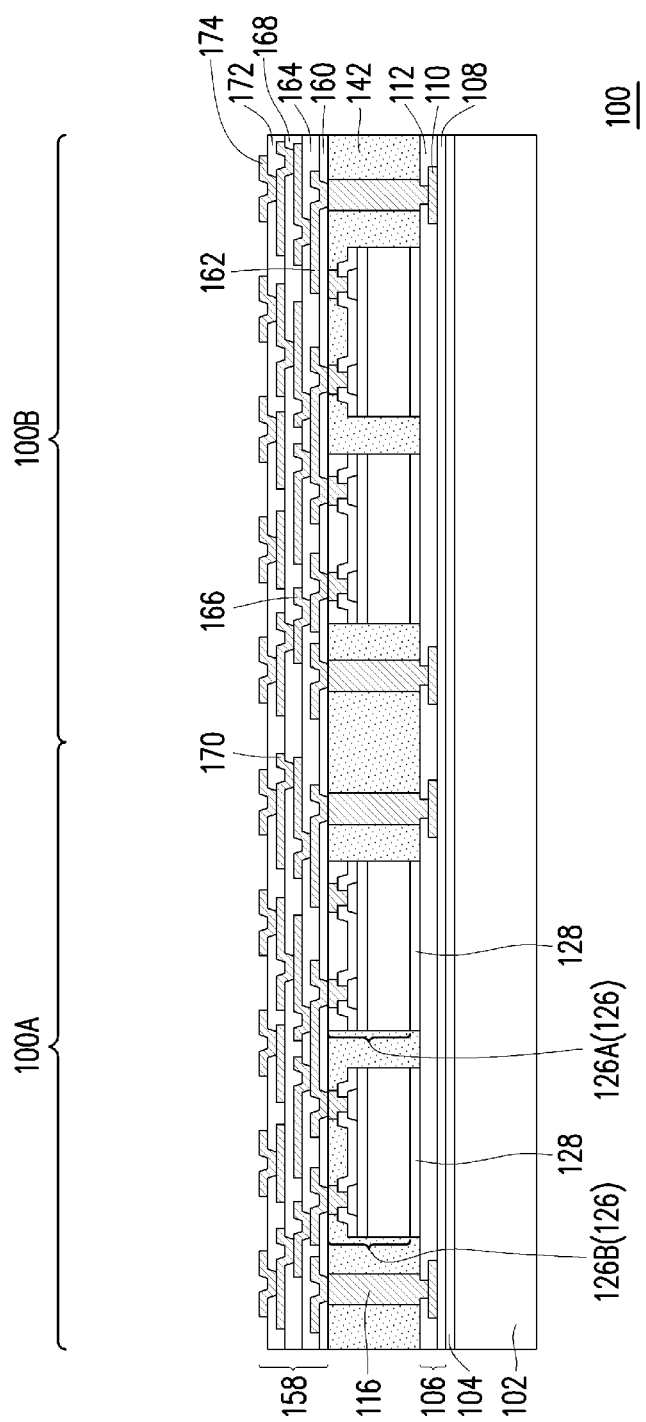
FIGS. 12 through 15 are cross-sectional views of intermediate steps during a process for forming a package component, in accordance with some embodiments.

In FIG. 12, the dielectric layer 164 is deposited on the metallization pattern 162 and dielectric layer 160. The dielectric layer 164 may be formed in a manner similar to the dielectric layer 160, and may be formed of the same material as the dielectric layer 160.

The metallization pattern 166 is then formed. The metallization pattern 166 includes conductive lines on and extending along the major surface of the dielectric layer 164. The metallization pattern 166 further includes conductive vias extending through the dielectric layer 164 to be physically and electrically connected to the metallization pattern 162. The metallization pattern 166 may be formed of the same material as the metallization pattern 162.

In some embodiments, the metallization pattern 166 is formed to a greater pitch than the metallization pattern 162. As such, conductive lines of the metallization pattern 166 may not include meandering conductive lines, and may only include straight conductive lines. Further, the metallization pattern 166 may not include dummy conductive features. In some embodiments, the metallization pattern 166 is formed in a manner similar to the metallization pattern 162, and includes the meandering portions and dummy conductive features.

The dielectric layer 168 is deposited on the metallization pattern 166 and dielectric layer 164. The dielectric layer 168 may be formed in a manner similar to the dielectric layer 160, and may be formed of the same material as the dielectric layer 160.

The metallization pattern 170 is then formed. The metallization pattern 170 includes conductive lines on and extending along the major surface of the dielectric layer 168. The metallization pattern 170 further includes conductive vias extending through the dielectric layer 168 to be physically and electrically connected to the metallization pattern 166. The metallization pattern 170 may be formed of the same material as the metallization pattern 162.

In some embodiments, the metallization pattern 170 is formed to a greater pitch than the metallization pattern 162. As such, conductive lines of the metallization pattern 170 may not include meandering conductive lines, and may only include straight conductive lines. Further, the metallization pattern 170 may not include dummy conductive features. In some embodiments, the metallization pattern 170 is formed in a manner similar to the metallization pattern 162, and includes the meandering portions and dummy conductive features.

The dielectric layer 172 is deposited on the metallization pattern 170 and dielectric layer 168. The dielectric layer 172 may be formed in a manner similar to the dielectric layer 160, and may be formed of the same material as the dielectric layer 160.

The UBMs 174 are formed on and extending through the dielectric layer 172. As an example to form the UBMs 174, the dielectric layer 172 may be patterned to form openings exposing portions of the metallization pattern 170. The patterning may be by an acceptable process, such as by exposing the dielectric layer 172 to light when the dielectric layer 172 is a photo-sensitive material or by etching using, for example, an anisotropic etch. If the dielectric layer 172 is a photo-sensitive material, the dielectric layer 172 can be developed after the exposure. The openings for the UBMs 174 may be wider than the openings for the conductive via portions of the metallization patterns 162, 166, and 170. A seed layer is formed over the dielectric layer 172 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 174. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBMs 174. In embodiments where the UBMs 174 are formed differently, more photoresist and patterning steps may be utilized.

Figure 13:
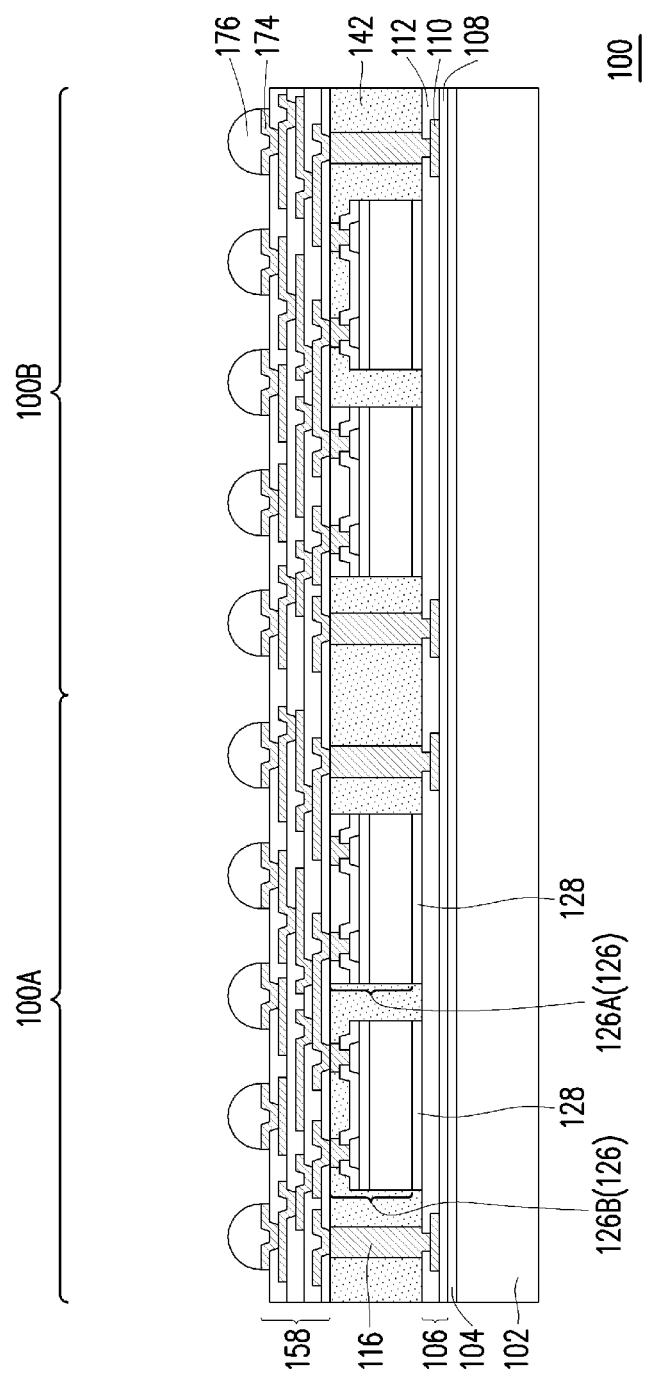

In FIG. 13, conductive connectors 176 are formed on the UBMs 174. The conductive connectors 176 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 176 may include a conductive material such as solder, copper, aluminum, gold, nickel, silver, palladium, tin, the like, or a combination thereof. In some embodiments, the conductive connectors 176 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 176 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 14:
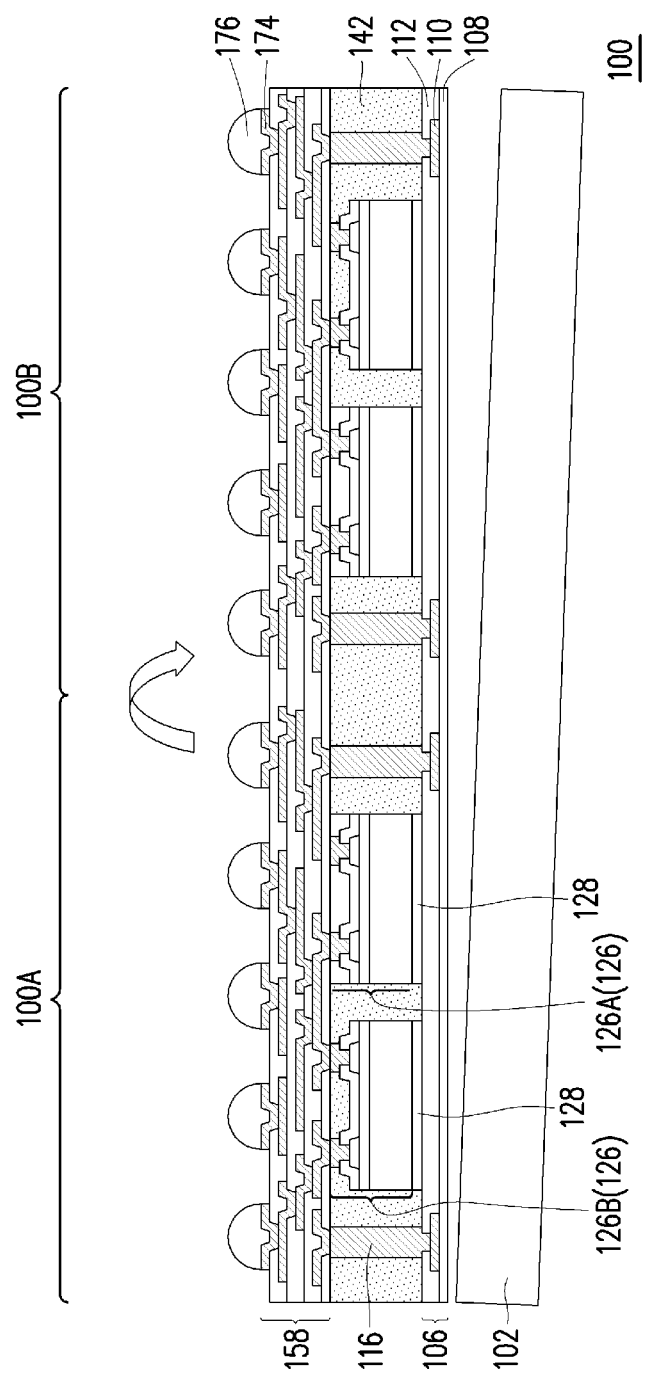

In FIG. 14, a carrier substrate de-bonding is performed to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape.

Figure 15:
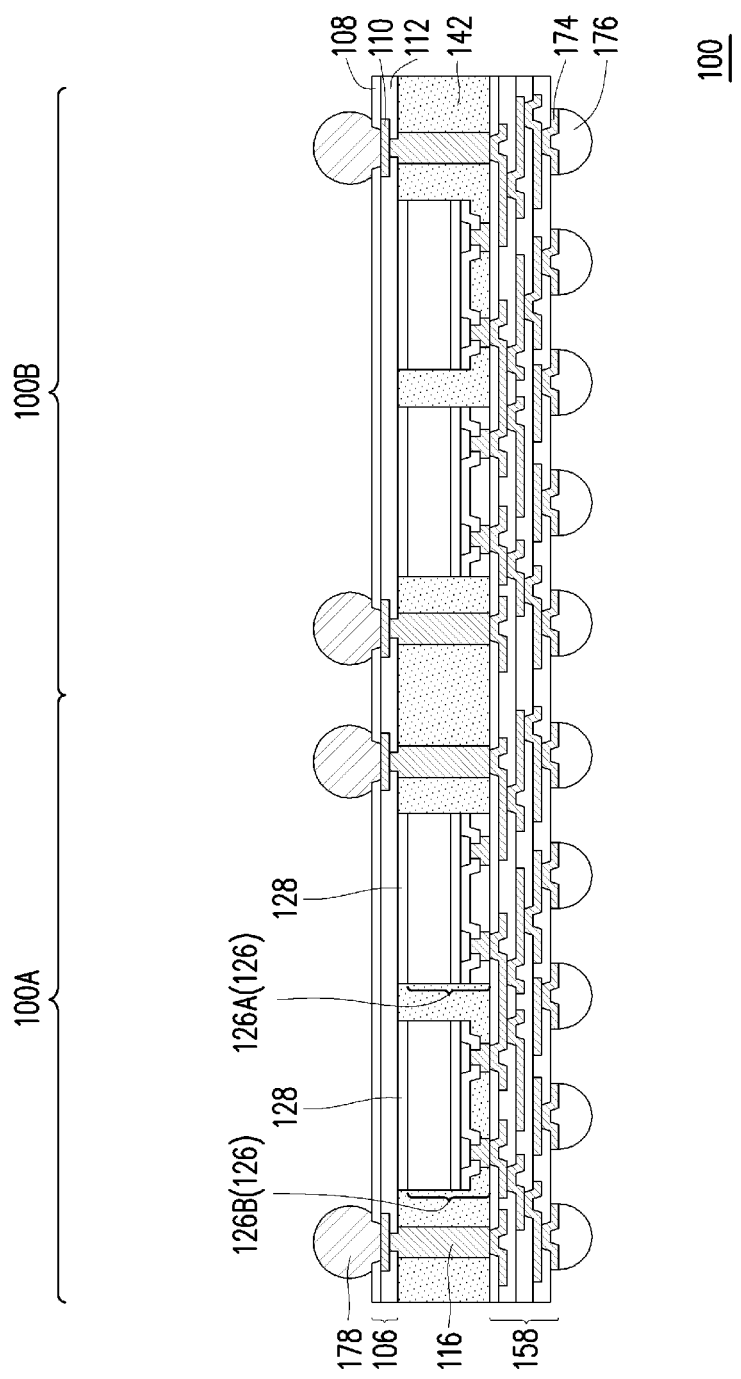

In FIG. 15, conductive connectors 178 are formed extending through the dielectric layer 108 to contact the metallization pattern 110. Openings are formed through the dielectric layer 108 to expose portions of the metallization pattern 110. The openings may be formed, for example, using laser drilling, etching, or the like. The conductive connectors 178 are formed in the openings. In some embodiments, the conductive connectors 178 comprise flux and are formed in a flux dipping process. In some embodiments, the conductive connectors 178 comprise a conductive paste such as solder paste, silver paste, or the like, and are dispensed in a printing process. In some embodiments, the conductive connectors 178 are formed in a manner similar to the conductive connectors 176, and may be formed of the same material as the conductive connectors 176.

In FIG. 16, second package components 200 are connected to the first package component 100. One of the second package components 200 are connected in each of the package regions 100A and 100B to form an integrated circuit device stack in each region of the first package component 100. The device stacks may also be referred to as package-on-package (PoP) structures.

The second package components 200 include a substrate 202 and one or more stacked dies 210 (210A and 210B) coupled to the substrate 202. Although one set of stacked dies 210 (210A and 210B) is illustrated, in other embodiments, a plurality of stacked dies 210 (each having one or more stacked dies) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and conductive vias 208. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210, and bond pads 206 on a second side of the substrate 202, the second side being opposite the first side of the substrate 202, to couple to the conductive connectors 178. In some embodiments, the bond pads 204 and 206 are formed by forming recesses (not shown) into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer (not shown) made of copper, titanium, nickel, gold, palladium, the like, or a combination thereof. The conductive material of the bond pads 204 and 206 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In an embodiment, the bond pads 204 and bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210 are coupled to the substrate 202 by wire bonds 212, although other connections may be used, such as conductive bumps. In an embodiment, the stacked dies 210 are stacked memory dies. For example, the stacked dies 210 may be memory dies such as low-power (LP) double data rate (DDR) memory modules, such as LPDDR1, LPDDR2, LPDDR3, LPDDR4, or the like memory modules.

The stacked dies 210 and the wire bonds 212 may be encapsulated by a molding material 214. The molding material 214 may be molded on the stacked dies 210 and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 210 and the wire bonds 212 are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the first package component 100 by way of the conductive connectors 178, the bond pads 206, and the back-side redistribution structure 106. In some embodiments, the stacked dies 210 may be coupled to the integrated circuit dies 126 through the wire bonds 212, the bond pads 204 and 206, conductive vias 208, the conductive connectors 178, and the through vias 116.

In some embodiments, a solder resist (not shown) is formed on the side of the substrate 202 opposing the stacked dies 210. The conductive connectors 178 may be disposed in openings in the solder resist to be electrically and mechanically coupled to conductive features (e.g., the bond pads 206) in the substrate 202. The solder resist may be used to protect areas of the substrate 202 from external damage.

In some embodiments, the conductive connectors 178 have an epoxy flux (not shown) formed thereon before they are reflowed with at least some of the epoxy portion of the epoxy flux remaining after the second package components 200 are attached to the first package component 100.

In some embodiments, an underfill (MUF) is formed between the first package component 100 and the second package components 200, surrounding the conductive connectors 178. The underfill (MUF) may reduce stress and protect the joints resulting from the reflowing of the conductive connectors 178. The underfill may be formed by a capillary flow process after the second package components 200 are attached, or may be formed by a suitable deposition method before the second package components 200 are attached. In embodiments where the epoxy flux is formed, it may act as the underfill.

In FIG. 17, a singulation process is performed by sawing along scribe line regions, e.g., between the first package region 100A and the second package region 100B. The sawing singulates the first package region 100A from the second package region 100B. The resulting, singulated device stack is from one of the first package region 100A or the second package region 100B. In some embodiments, the singulation process is performed after the second package components 200 are connected to the first package component 100. In other embodiments (not shown), the singulation process is performed before the second package components 200 are connected to the first package component 100, such as after the carrier substrate 102 is de-bonded and the conductive connectors 178 are formed.

The first package component 100 is then mounted to a package substrate 300 using the conductive connectors 176. The package substrate 300 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 300 may be a SOI substrate. Generally, an SOI substrate includes a layer of a semiconductor material such as epitaxial silicon, germanium, silicon germanium, SOI, SGOI, or combinations thereof. The package substrate 300 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 300.

The package substrate 300 may include active and passive devices (not shown). As one of ordinary skill in the art will recognize, a wide variety of devices such as transistors, capacitors, resistors, combinations of these, and the like may be used to generate the structural and functional requirements of the design for the device stack. The devices may be formed using any suitable methods.

The package substrate 300 may also include metallization layers and vias (not shown) and bond pads 302 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 300 is substantially free of active and passive devices.

In some embodiments, the conductive connectors 176 are reflowed to attach the first package component 100 to the bond pads 302. The conductive connectors 176 electrically and/or physically couple the package substrate 300, including metallization layers in the package substrate 300, to the first package component 100. In some embodiments, passive devices (e.g., surface mount devices (SMDs), not illustrated) may be attached to the first package component 100 (e.g., bonded to the bond pads 302) prior to mounting on the package substrate 300. In such embodiments, the passive devices may be bonded to a same surface of the first package component 100 as the conductive connectors 176.

The conductive connectors 176 may have an epoxy flux (not shown) formed thereon before they are reflowed with at least some of the epoxy portion of the epoxy flux remaining after the first package component 100 is attached to the package substrate 300. This remaining epoxy portion may act as an underfill to reduce stress and protect the joints resulting from the reflowing the conductive connectors 176. In some embodiments, an underfill (not shown) may be formed between the first package component 100 and the package substrate 300 and surrounding the conductive connectors 176. The underfill may be formed by a capillary flow process after the first package component 100 is attached or may be formed by a suitable deposition method before the first package component 100 is attached.

It should be appreciated that the package component 100 may be implement in other device stacks. For example, a PoP structure is shown in FIGS. 16 and 17, but the package component 100 may also be implemented in a Flip Chip Ball Grid Array (FCBGA) package. In such embodiments, the package component 100 is mounted to a substrate such as the package substrate 300, but the second package component 200 is omitted. Instead, a lid or heat spreader may be attached to the package component 100.

Embodiments may achieve advantages. Forming the meandering portions 150 of the metallization pattern 162 over the non-contact regions 146 of the integrated circuit dies 126 may improve the mechanical strength of the conductive lines 162A. Further, they may affect etching characteristics when removing excess seed layer of the metallization pattern 162, reducing width loss of the conductive lines 162A during etching. Avoiding width loss may be particularly advantageous with finer-pitch metallization patterns, as the risk of line breakage may be reduced.

In an embodiment, a device includes: a first integrated circuit die including first die connectors, the first integrated circuit die having a first contact region and a first non-contact region, the first contact region being a continuous region including the first die connectors, the first non-contact region extending from edges of the first integrated circuit die to the first contact region; an encapsulant contacting sides of the first integrated circuit die; a dielectric layer contacting the encapsulant and the first integrated circuit die, the dielectric layer having a first portion over the first contact region, a second portion over the first non-contact region, and a third portion over a portion of the encapsulant; and a metallization pattern including: a first conductive via extending through the first portion of the dielectric layer to contact one of the first die connectors of the first integrated circuit die; and a conductive line extending along the second portion and the third portion of the dielectric layer, the conductive line having a first meandering portion along the second portion of the dielectric layer and a straight portion along the third portion of the dielectric layer.

In some embodiments, the device further includes: a second integrated circuit die including second die connectors, the second integrated circuit die having a second contact region and a second non-contact region, the second contact region being a continuous region including the second die connectors, the second non-contact region extending from edges of the second integrated circuit die to the second contact region, the second integrated circuit die being laterally separated from the first integrated circuit die by the portion of the encapsulant. In some embodiments of the device, the dielectric layer has a fourth portion over the second non-contact region and a fifth portion over the second contact region, the conductive line having a second meandering portion along the fourth portion of the dielectric layer, the metallization pattern further including: a second conductive via extending through the fifth portion of the dielectric layer to contact one of the second die connectors of the second integrated circuit die, the conductive line connecting the first conductive via to the second conductive via. In some embodiments of the device, the straight portion of the conductive line has a single longitudinal axis and extends continuously across the third portion of the dielectric layer. In some embodiments of the device, the first meandering portion of the conductive line includes: a first segment having a longitudinal axis parallel to the longitudinal axis of the straight portion; and a plurality of second segments connected to the first segment, the second segments having longitudinal axes, the longitudinal axes of the second segments each being deflected from the longitudinal axis of the first segment by a same first angle. In some embodiments of the device, the first meandering portion of the conductive line has a first width, the straight portion of the conductive line has a second width, and the second width is greater than the first width. In some embodiments of the device, the conductive line further has a connecting portion electrically coupling the first conductive via to the first meandering portion, the connecting portion having a third width, the third width being greater than the first width and less than the second width. In some embodiments of the device, the metallization pattern further includes: a dummy conductive feature extending along the first portion of the dielectric layer, the dummy conductive feature disposed at least partially around the first conductive via. In some embodiments of the device, the dummy conductive feature is electrically connected to a ground terminal. In some embodiments of the device, the dummy conductive feature is electrically connected to a power terminal.

In an embodiment, a device includes: a first integrated circuit die including first die connectors, the first integrated circuit die having a first contact region and a first non-contact region, the first contact region being a continuous region including the first die connectors, the first non-contact region extending from edges of the first integrated circuit die to the first contact region; a second integrated circuit die including second die connectors, the second integrated circuit die being disposed adjacent the first integrated circuit die, the second integrated circuit die having a second contact region and a second non-contact region, the second contact region being a continuous region including the second die connectors, the second non-contact region extending from edges of the second integrated circuit die to the second contact region; an encapsulant disposed between the first integrated circuit die and the second integrated circuit die; a first dielectric layer on the encapsulant, the first integrated circuit die, and the second integrated circuit die; a first metallization pattern extending along and through the first dielectric layer, the first metallization pattern having meandering conductive lines over the first and second non-contact regions; a second dielectric layer on the first metallization pattern; and a second metallization pattern extending along and through the second dielectric layer, the second metallization pattern having straight conductive lines over the first and second non-contact regions.

In some embodiments of the device, the first metallization pattern includes: a conductive via extending through the first dielectric layer to contact one of the first die connectors of the first integrated circuit die, the conductive via being electrically connected to a conductive line of the meandering conductive lines; and a dummy conductive feature disposed at least partially around the conductive via and at least partially along the conductive line. In some embodiments of the device, the dummy conductive feature includes: a single continuous conductive bar extending along a first side of the conductive line, around the conductive via, and along a second side of the conductive line. In some embodiments of the device, the dummy conductive feature includes: a conductive bar extending along a first side of the conductive line and partially around the conductive via; and a conductive island extending along a second side of the conductive line, a width of the conductive island being greater than a width of the conductive bar. In some embodiments of the device, the dummy conductive feature includes: a conductive bar extending along a first side of the conductive line and partially around the conductive via; and conductive traces disposed along a second side of the conductive line, a length of the conductive bar being greater than widths of the conductive traces. In some embodiments of the device, the dummy conductive feature includes: conductive traces disposed discontinuously along a first side of the conductive line, around all of the conductive via, and along a second side of the conductive line. In some embodiments of the device, the dummy conductive feature includes: conductive traces disposed discontinuously along a first side of the conductive line, around a portion of the conductive via, and along a second side of the conductive line. In some embodiments of the device, the dummy conductive feature is disposed around a first portion of the conductive line, the first portion of the conductive line having a greater width than portions of the conductive line disposed over the first and second non-contact regions.

In an embodiment, a method includes: attaching a first integrated circuit die adjacent to a second integrated circuit die, the first and second integrated circuit dies being separated by a gap region, the first and second integrated circuit dies having contact regions including die connectors and non-contact regions being free from the die connectors, the non-contact regions being disposed adjacent edges of the first and second integrated circuit dies; depositing a first dielectric layer over the first and second integrated circuit dies; forming a first metallization pattern extending along and through the first dielectric layer, the first metallization pattern including straight conductive lines over the gap region and meandering conductive lines over the non-contact regions; depositing a second dielectric layer over the first metallization pattern; and forming a second metallization pattern extending along and through the second dielectric layer, the second metallization pattern including straight conductive lines over the gap region and the non-contact regions.

In some embodiments of the method, forming the first metallization pattern includes: forming conductive vias electrically connected to the first and second integrated circuit dies; forming the meandering conductive lines, the meandering conductive lines being electrically connected to the conductive vias; forming the straight conductive lines, the straight conductive lines being electrically connected to the meandering conductive lines; and forming dummy conductive features, the dummy conductive features being disposed at least partially around the conductive vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first integrated circuit die comprising first die connectors, the first integrated circuit die having a first contact region and a first non-contact region, the first contact region being a continuous region including the first die connectors, the first non-contact region extending from edges of the first integrated circuit die to the first contact region;
an encapsulant contacting sides of the first integrated circuit die;
a dielectric layer contacting the encapsulant and the first integrated circuit die, the dielectric layer having a first portion over the first contact region, a second portion over the first non-contact region, and a third portion over a portion of the encapsulant; and
a metallization pattern comprising:
a first conductive via extending through the first portion of the dielectric layer to contact one of the first die connectors of the first integrated circuit die; and
a conductive line extending along the second portion and the third portion of the dielectric layer, the conductive line having a first meandering portion along the second portion of the dielectric layer and a straight portion along the third portion of the dielectric layer, wherein the straight portion of the conductive line has a single longitudinal axis and extends continuously across the third portion of the dielectric layer, wherein the first meandering portion of the conductive line has a first width, the straight portion of the conductive line has a second width, and the second width is greater than the first width, and wherein the conductive line further has a connecting portion electrically coupling the first conductive via to the first meandering portion, the connecting portion having a third width, the third width being greater than the first width and less than the second width.

2. The device of claim 1 further comprising:
a second integrated circuit die comprising second die connectors, the second integrated circuit die having a second contact region and a second non-contact region, the second contact region being a continuous region including the second die connectors, the second non-contact region extending from edges of the second integrated circuit die to the second contact region, the second integrated circuit die being laterally separated from the first integrated circuit die by the portion of the encapsulant.

3. The device of claim 2, wherein the dielectric layer has a fourth portion over the second non-contact region and a fifth portion over the second contact region, the conductive line having a second meandering portion along the fourth portion of the dielectric layer, the metallization pattern further comprising:
a second conductive via extending through the fifth portion of the dielectric layer to contact one of the second die connectors of the second integrated circuit die, the conductive line connecting the first conductive via to the second conductive via.

4. The device of claim 1, wherein the first meandering portion of the conductive line comprises:
a first segment having a longitudinal axis parallel to the longitudinal axis of the straight portion; and
a plurality of second segments connected to the first segment, the second segments having longitudinal axes, the longitudinal axes of the second segments each being deflected from the longitudinal axis of the first segment by a same first angle.

5. The device of claim 1, wherein the metallization pattern further comprises:
a dummy conductive feature extending along the first portion of the dielectric layer, the dummy conductive feature disposed at least partially around the first conductive via.

6. The device of claim 5, wherein the dummy conductive feature is electrically connected to a ground terminal.

7. The device of claim 5, wherein the dummy conductive feature is electrically connected to a power terminal.

8. A device comprising:
a first integrated circuit die comprising first die connectors, the first integrated circuit die having a first contact region and a first non-contact region, the first contact region being a continuous region including the first die connectors, the first non-contact region extending from edges of the first integrated circuit die to the first contact region;
a second integrated circuit die comprising second die connectors, the second integrated circuit die being disposed adjacent the first integrated circuit die, the second integrated circuit die having a second contact region and a second non-contact region, the second contact region being a continuous region including the second die connectors, the second non-contact region extending from edges of the second integrated circuit die to the second contact region;
an encapsulant disposed between the first integrated circuit die and the second integrated circuit die;
a first dielectric layer on the encapsulant, the first integrated circuit die, and the second integrated circuit die;
a first metallization pattern extending along and through the first dielectric layer, the first metallization pattern having meandering conductive lines over the first and second non-contact regions, wherein the first metallization pattern comprises:
a conductive via extending through the first dielectric layer to contact one of the first die connectors of the first integrated circuit die, the conductive via being electrically connected to a conductive line of the meandering conductive lines; and
a dummy conductive feature disposed at least partially around the conductive via and at least partially along the conductive line;
a second dielectric layer on the first metallization pattern; and
a second metallization pattern extending along and through the second dielectric layer, the second metallization pattern having straight conductive lines over the first and second non-contact regions.

9. The device of claim 8, wherein the dummy conductive feature comprises:
a single continuous conductive bar extending along a first side of the conductive line, around the conductive via, and along a second side of the conductive line.

10. The device of claim 8, wherein the dummy conductive feature comprises:
a conductive bar extending along a first side of the conductive line and partially around the conductive via; and
a conductive island extending along a second side of the conductive line, a width of the conductive island being greater than a width of the conductive bar.

11. The device of claim 8, wherein the dummy conductive feature comprises:
a conductive bar extending along a first side of the conductive line and partially around the conductive via; and
conductive traces disposed along a second side of the conductive line, a length of the conductive bar being greater than widths of the conductive traces.

12. The device of claim 8, wherein the dummy conductive feature comprises:
conductive traces disposed discontinuously along a first side of the conductive line, around all of the conductive via, and along a second side of the conductive line.

13. The device of claim 8, wherein the dummy conductive feature comprises:
conductive traces disposed discontinuously along a first side of the conductive line, around a portion of the conductive via, and along a second side of the conductive line.

14. The device of claim 8, wherein the dummy conductive feature is disposed around a first portion of the conductive line, the first portion of the conductive line having a greater width than portions of the conductive line disposed over the first and second non-contact regions.

15. A method comprising:
attaching a first integrated circuit die adjacent to a second integrated circuit die, the first and second integrated circuit dies being separated by a gap region, the first and second integrated circuit dies having contact regions comprising die connectors and non-contact regions being free from the die connectors, the non-contact regions being disposed adjacent edges of the first and second integrated circuit dies;

depositing a first dielectric layer over the first and second integrated circuit dies;

forming a first metallization pattern extending along and through the first dielectric layer, the first metallization pattern comprising straight conductive lines over the gap region and meandering conductive lines over the non-contact regions, wherein forming the first metallization pattern comprises:

forming conductive vias electrically connected to the first and second integrated circuit dies;

forming the meandering conductive lines, the meandering conductive lines being electrically connected to the conductive vias;

forming the straight conductive lines, the straight conductive lines being electrically connected to the meandering conductive lines; and forming dummy conductive features, the dummy conductive features being disposed at least partially around the conductive vias;

depositing a second dielectric layer over the first metallization pattern; and forming a second metallization pattern extending along and through the second dielectric layer, the second metallization pattern comprising straight conductive lines over the gap region and the non-contact regions.

16. The method of claim 15, wherein the dummy conductive features are formed concurrently with the conductive vias, the meandering conductive lines, and the straight conductive lines.

17. The method of claim 15, wherein forming the dummy conductive features comprises:

connecting the dummy conductive features to a ground terminal.

18. The method of claim 15, wherein forming the dummy conductive features comprises:

connecting the dummy conductive features to a power terminal.

19. The method of claim 15, wherein each of the dummy conductive features are disposed at least partially along a respective one of the meandering conductive lines.

20. The method of claim 15, wherein the straight conductive lines are wider than the meandering conductive lines.

* * * * *